(12) United States Patent
Belfi et al.

(10) Patent No.: US 10,261,109 B2
(45) Date of Patent: Apr. 16, 2019

(54) PROBE CARD SUPPORT INSERT, CONTAINER, SYSTEM AND METHOD FOR STORING AND TRANSPORTING ONE OR MORE PROBE CARDS

(71) Applicant: GLOBALFOUNDRIES INC., Grand Cayman (KY)

(72) Inventors: Christopher Belfi, Mechanicville, NY (US); Amy Kraus, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 41 days.

(21) Appl. No.: 15/597,202

(22) Filed: May 17, 2017

(65) Prior Publication Data

US 2018/0335448 A1   Nov. 22, 2018

(51) Int. Cl.
*G01R 1/04* (2006.01)
*G01R 1/073* (2006.01)

(52) U.S. Cl.
CPC ....... *G01R 1/07314* (2013.01); *G01R 1/0408* (2013.01)

(58) Field of Classification Search
CPC ............ G01R 31/2893; G01R 31/2865; G01R 1/06705
See application file for complete search history.

(56) References Cited

U.S. PATENT DOCUMENTS

| 6,958,618 | B2 | 10/2005 | Amemiya et al. |
| 7,541,801 | B2 | 6/2009 | Nagasaka et al. |
| 7,684,888 | B2 | 3/2010 | Chen et al. |
| 7,887,277 | B2 | 2/2011 | Campbell et al. |
| 8,350,191 | B2 * | 1/2013 | Ondricek ........... G01R 31/2874 206/710 |

FOREIGN PATENT DOCUMENTS

| CN | 1519572 A | 12/2003 |
| CN | 100552454 C | 10/2009 |
| CN | 102023239 B | 1/2013 |
| CN | 203774270 U | 8/2014 |
| WO | 2012099921 A1 | 7/2012 |

* cited by examiner

*Primary Examiner* — Alesa Allgood
(74) *Attorney, Agent, or Firm* — Francois Pagette; Hoffman Warnick LLC

(57) ABSTRACT

A container for storing and transporting a probe card, the container having a container body having an interior surface configured to define: an interior space for housing the probe card, and an opening sized to allow insertion and removal of the probe card into and out of the interior space; a lid configured to be removably fitted to the opening of the container body to close the opening; and a probe card support insert connected to the interior surface of the container body, wherein the probe card support insert has a probe card support surface configured to support a more probe card housed in the interior space of the container body, wherein the interior surface of the container body and the probe card support insert are configured to be removably connected.

5 Claims, 8 Drawing Sheets

PROBE CARD SUPPORT INSERT, CONTAINER, SYSTEM AND METHOD FOR STORING AND TRANSPORTING ONE OR MORE PROBE CARDS

BACKGROUND

1. Field

Embodiments disclosed herein relate to techniques for storing and transporting one or more probe cards. Such techniques include a probe card support insert for storing one or more probe cards, a container including the probe card support insert, a system including the container and the probe card support insert for transporting one or more probe cards, and a method for storing and transporting one or more probe cards.

2. Description of the Related Art

In general, a semiconductor fabrication process involves various process equipments and fabrication process steps to build individual integrated circuits in a wafer. Each of the individual integrated circuits are provided with one or more metal pads on the surface of the wafer's surface. Signals are passed to and from each of the individual integrated circuits through the one or more metal pads.

The semiconductor fabrication process includes a wafer testing step in which the individual integrated circuits in the wafer are tested for functional defects. The wafer testing step is performed before a die preparation step that cuts the wafer into separate dies each including semiconducting material on which a given integrated circuit is built.

In the wafer testing step, an electronic test system, a prober, and a probe card are used to test the individual integrated circuits in the wafer. The individual integrated circuits in the wafer are tested by a series of electrical test signals sent by the electronic test system. The probe card is an interface between the electronic test system and the wafer. The probe card provides an electrical path between the electronic test system and the metal pads of the individual integrated circuits in the wafer, thereby permitting the passing of signals between the electronic test system and the integrated circuits in the wafer. The probe card is effectively a custom connector that takes the universal pattern of a given electronic test system and translates the signals to connect to the metal pads on the surface of the wafer. The probe card includes a plurality of probe tips that can be moved into electrical and mechanical contact with the metal pads on the surface of the wafer. Signals between the electronic test system and the integrated circuits of the wafer are passed through the electrical connections formed by the probe tips and the metal pads. An integrated circuit's response to test signals passed from the electronic test system to the integrated circuit through the electrical connection formed by a probe tip and a metal pad of the integrated circuit indicates whether the integrated circuit was fabricated correctly or incorrectly. The probe card can have a plurality of probe tips to allow for efficient simultaneous testing of multiple integrated circuits on the wafer. Integrated circuits that are fabricated incorrectly can then be removed during the die preparation step.

In the wafer testing step, the prober holds the wafer and the probe card, and aligns the wafer and the probe card to bring the probe tips into electrical and mechanical contact with the metal pads on the surface of the wafer. As an example, for dynamic random-access memory (DRAM) devices and FLASH memory devices provided on the wafer, each of the metal pads can have a size of approximately 40-90 micrometers per side. Each probe tip of the probe card that is to be brought into contact with a corresponding metal pad has a size that is smaller than the size of the metal pad.

Probe cards are manufactured with high precision in order to ensure precise mechanical and electrical contact between each of a plurality of probe tips with corresponding and relatively small metal pads on the wafer under testing. Probe cards can be fragile and easily susceptible to damage due to the small size of the probe tips. Probe cards can cost approximately $6,000 to $250,000 to manufacture. Further, depending on the complexity of the probe card, remanufacturing and repairing a damaged probe card can take from a few days to a few weeks.

Several conventional approaches are used to store probe cards. Probe cards can be stored on card racks, which hold multiple probe cards. Individual probe cards can also be stored in molded probe card protectors to protect the probe card from accidental damage. The probe card protectors can protect the probe card during transportation, and can protect the probe card from direct contact with the card rack. Further, the probe card protectors can provide a protective environment to reduce exposure of the stored probe cards to environmental contaminants.

In the semiconductor fabrication process, it is sometimes necessary to transport a probe card from one cleanroom facility to another cleanroom facility. The transportation of the probe card can be a multi-step manual process. In an example of the multi-step manual process, a technician wearing a first cleanroom suit may retrieve the probe card from a first clean room, leave the first clean room, remove the first cleanroom suit, manually transport the probe card to a different location, put on a second cleanroom suit, wipe down the probe card, enter a second clean room, and load the probe card to a prober or store the probe card in a rack in the second clean room. This manual process can take 30 minutes, for example.

There exists a need for alternative techniques to store one or more probe cards in a manner to decrease the likelihood of damage to the one or more probe cards. Further, there exists a need for alternative techniques to more efficiently transport the one or more probe cards while decreasing the likelihood of damage to the one or more probe cards during transportation.

BRIEF SUMMARY

In an aspect of the present invention, a container for storing and transporting one or more probe cards is provided. The container for storing one or more probe cards has a container body having an interior surface configured to define: an interior space for housing the one or more probe cards, and an opening sized to allow insertion and removal of the one or more probe cards into and out of the interior space; a lid configured to be removably fitted to the opening of the container body to close the opening; and one or more probe card support inserts connected to the interior surface of the container body, wherein each of the one or more probe card support insert has one or more probe card support surfaces configured to support a first of the one or more probe cards housed in the interior space of the container body, wherein the interior surface of the container body and the each of the one or more probe card support inserts are configured to be removably connected.

In another aspect of the present invention, a probe card support insert for use with a container is provided, wherein the container has: a container body comprising an interior surface configured to define: an interior space for housing the one or more probe cards, and an opening sized to allow insertion and removal of the one or more probe cards into and out of the interior space; and a lid configured to be removably fitted to the opening of the container body to close the opening, and wherein the probe card support insert has: a support shell configured to be removably connected to an interior surface of the container body; and one or more support surfaces connected to the support shell, wherein each of the one or more support surfaces are configured to support a corresponding one or more probe cards.

In another aspect of the present invention, a system for transporting one or more probe cards is provided.

In another aspect of the present invention, a method for storing and transporting one or more probe cards is provided.

Advantages of the invention will be set forth in the description which follows, and in part will be obvious from the description, or may be learned by practice of the invention.

BRIEF DESCRIPTION OF SEVERAL VIEWS OF THE DRAWINGS

One or more aspects of the present invention are particularly pointed out and distinctly claimed at the conclusion of the specification. The foregoing and other objects, features, and advantages of the invention are apparent from the following detailed description taken in conjunction with the accompanying drawings in which:

FIG. 3A depicts a top view of the probe card support insert. FIG. 3B depicts a perspective view of the probe card support insert. FIG. 3C depicts a front view of the probe card support insert. FIG. 3D depicts a right side view of the probe card support insert, wherein a left side view of the probe card support insert is a mirror image of the ride side view. FIG. 3E depicts a rear view of the probe card support insert.

DETAILED DESCRIPTION

A container 100 for storing and transporting one or more probe cards will be described. The apparatus will be described with references to FIGS. 1-3.

The container 100 can include an external container 300 and one or more probe card support inserts 500 that is/are configured to be removably housed within the external container 300.

Figure 2:
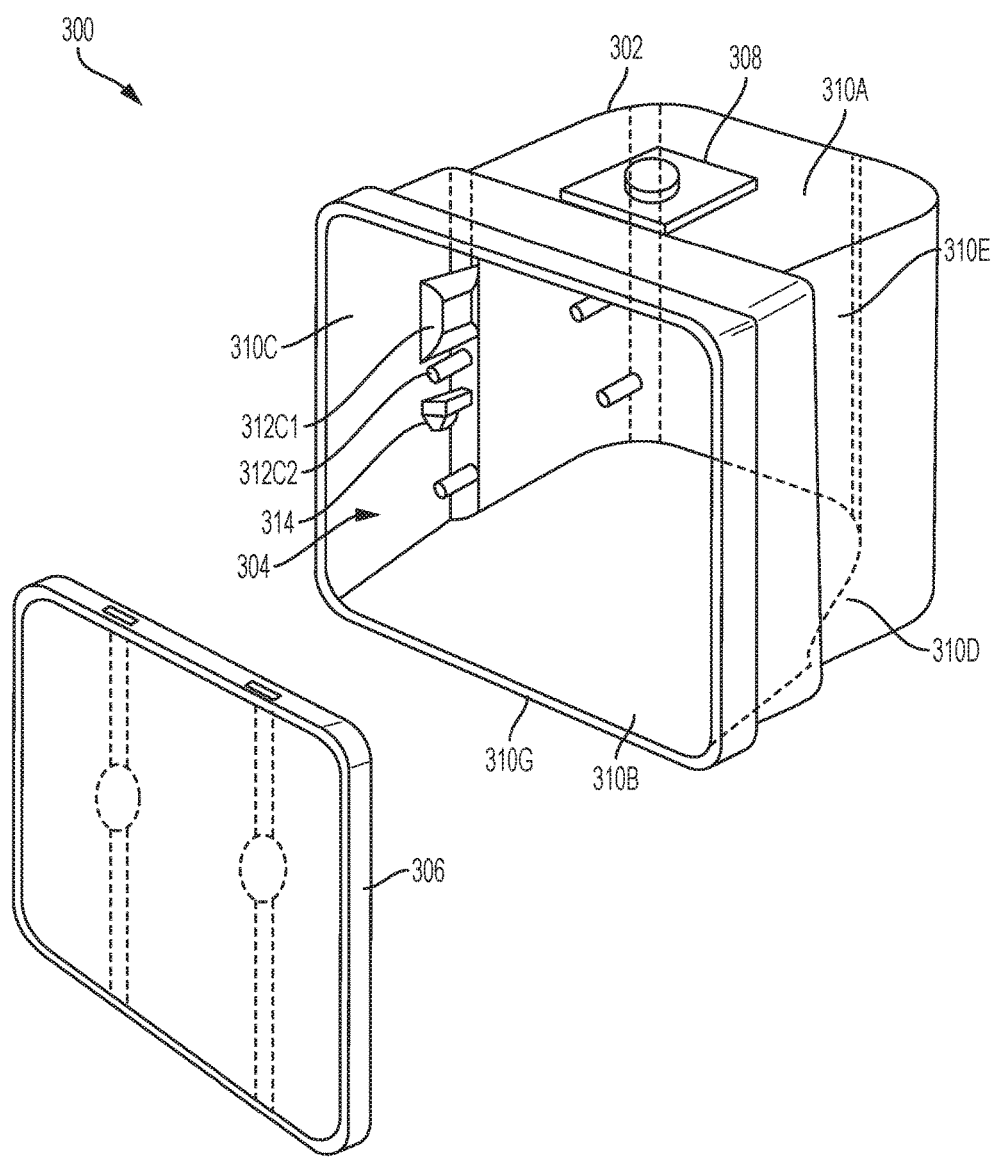
FIG. 2 depicts a perspective view of the external container.

The structure of the external container 300 will be described below with reference to FIG. 2.

The external container 300 can include a container body 302 formed in a box-like shape having an opening 304 at one end; a lid 306 for airtightly covering the opening 304 of the container body 302 to isolate the interior of the container body 302 from the external environment; a grip 308 configured to be gripped by a transfer arm of a transfer system to lift the external container 300 and one or more handles (not shown) gripped by a technician's hand to lift the external container 300.

The container body 302 can be formed in an almost cubic shape as a whole. The container body 302 can include four sidewalls 310A, 310B, 310C, and 310D, and a back plate 310E, and can be provided with an opening 304 at a front portion thereof opposite of the back plate 310E. An outer side of the sidewall 310B, which corresponds to a bottom of the container body 302, can include alignment means (not shown) such as one or more grooves in which corresponding one or more kinematic pins are to be fitted. The grip 308 can be provided on an outer side of sidewall 310A, which corresponds to a top of the container body 302. The one or more handles can be provided on outer sides of the sidewall 310C and the sidewall 310D which can extend substantially vertically from the sidewall 310B towards the sidewall 310A.

At end portions (corresponding to the opening 304) of the respective sidewalls 310A-D of the container body 302, a lid receiving portion 310G in which the lid 306 is to be fitted is provided. In the lid receiving portion 310G, fitted portions are provided, which are concave portions fitted with a latch mechanism of the lid 306 to secure the lid 306 to the container body 302.

The lid 306 is a member for covering the opening 310F of the container body 302. The lid 306 is formed in a substantially flat plate shape, and fitted to the lid receiving portion 310G of the container body 302. Between the lid 306 and the container body 302 is provided the latch mechanism for retaining the lid 306. On an outer surface of the lid 306, mechanism for operating the latch mechanism can be provided.

Sealing material can be provided between the lid 306 and the container body 302. The sealing material airtightly isolates the interior of the container body 302 from the external environment. The sealing material can be provided on an inner surface of the lid 306 for abutting contact with the lid receiving portion 310G of the container body 302 around its entire circumference to seal the interior of the container body 302.

Figure 1:
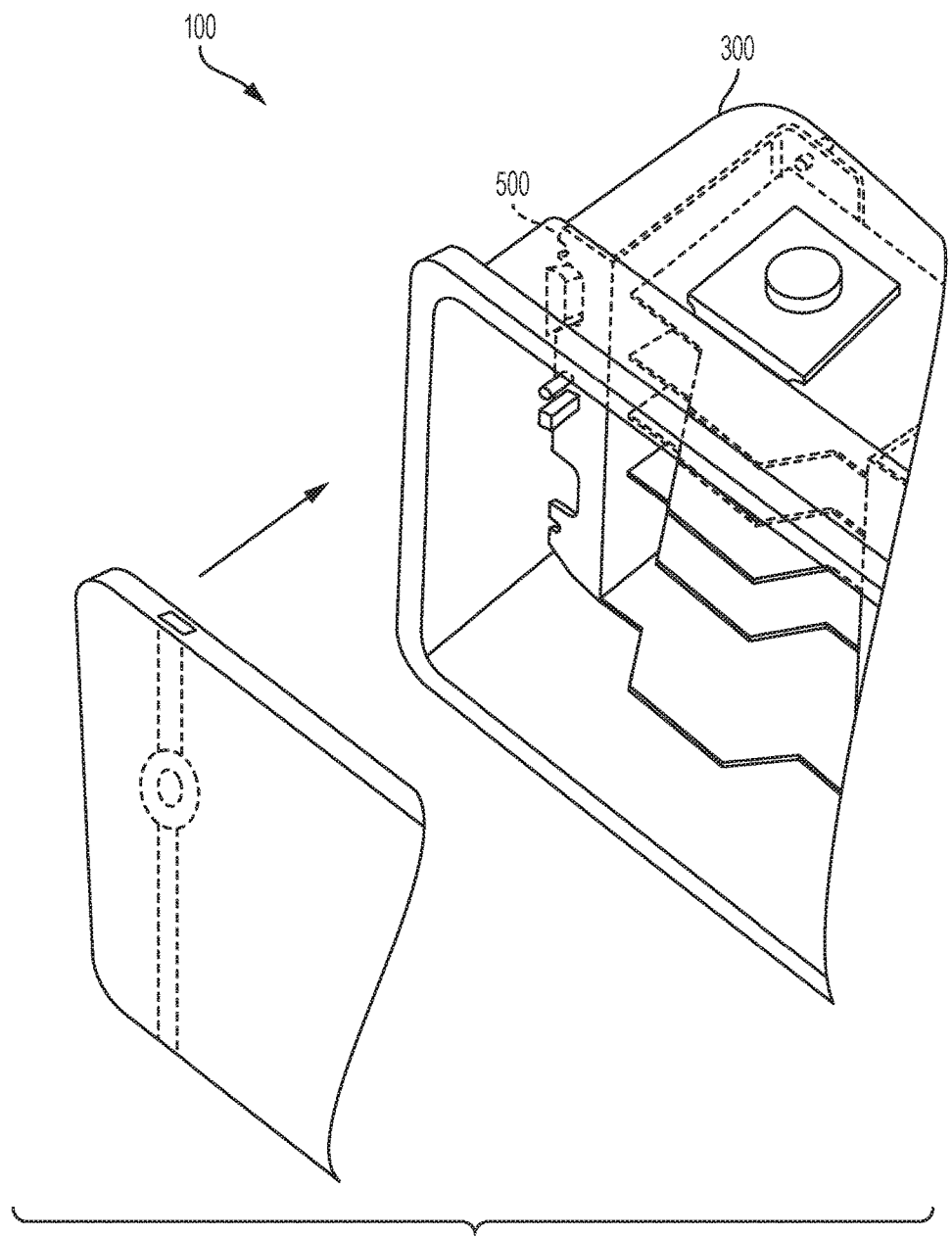
FIG. 1 depicts a perspective view of a container including an external container and a probe support insert for holding and transporting one or more probe cards and/or one or more molded probe card protectors.
Figure 3:
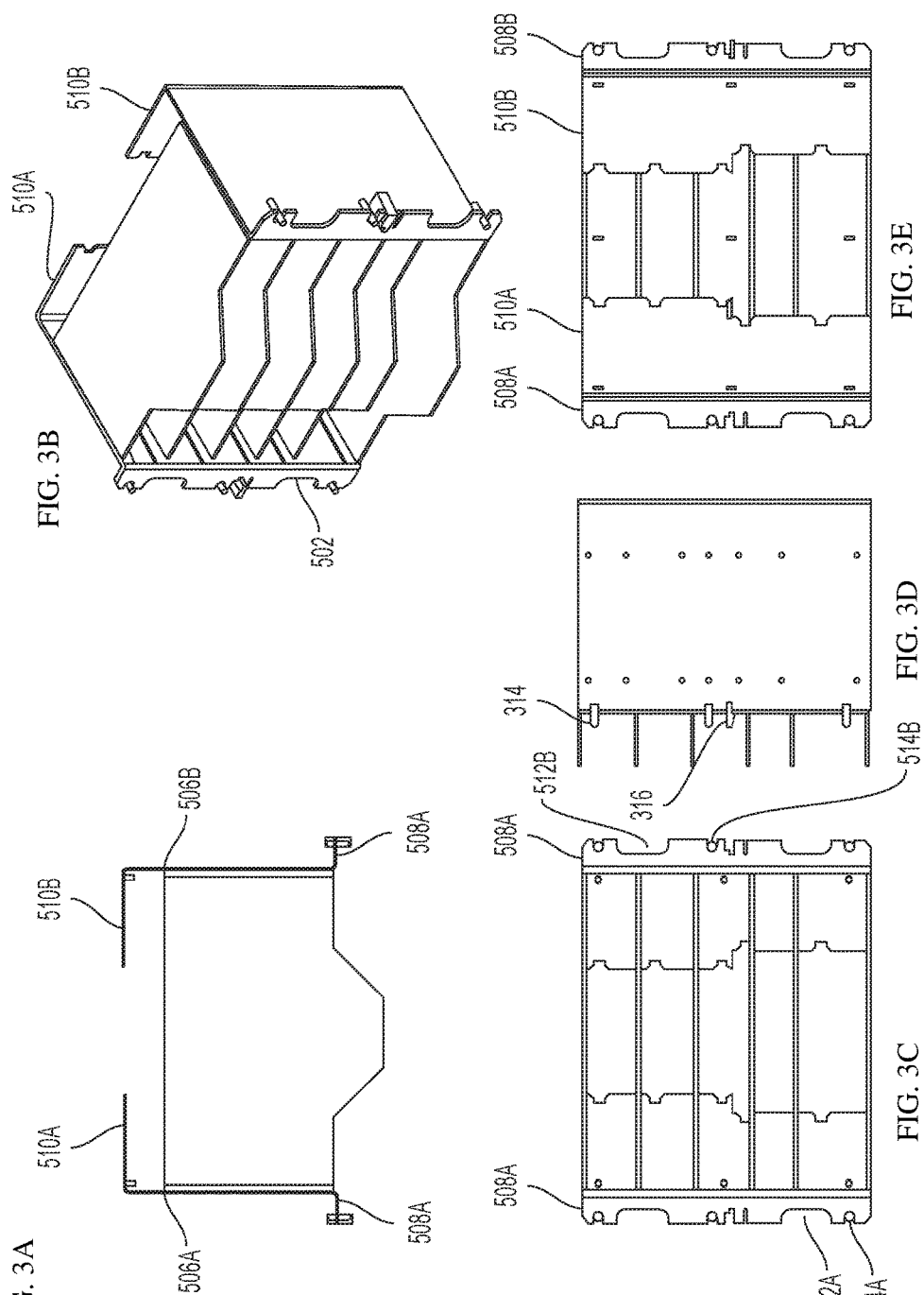
FIGS. 3A-E depict a probe card support insert.

The structure of the probe card support insert 500, and the structure of the external container 300 for guiding the probe card support insert 500 into the interior of the container body 302 and for retaining the probe card support insert 500 within the interior of the container body 302 will be described below with reference to FIGS. 1-3.

The outer dimensions of the probe card support insert 500 can be set so that the probe card support insert 500 can be removably inserted within the interior of the container body 302. Further, the external container 300 and the probe card support insert 500 can be configured such that the probe card support insert 500 can be secured to one or more of the interior sides of the sidewalls 310A-D, and the interior side of back plate 310E. Further, the probe card support insert 500 can be configured to support one or more probe cards, or one or more molded plastic probe card protectors holding corresponding one or more probe cards. Still further, the probe card support insert 500 can be configured to minimize movement of the one or more probe cards relative to the external container 300 while the one or more probe cards are supported by the probe card support insert 500 within the interior of the container body 302.

An example of the probe card support insert 500 will be described below with reference to FIG. 3.

The probe card support insert 500 can include one or more support surfaces 502 and a support shell 504. The one or more support surfaces 502 and the support shell 504 can each be formed of material such as polycarbonate, aluminum, or stainless steel.

Each of the one or more support surfaces 502 can include an upper surface that directly supports a probe card or a molded probe card protector placed thereon, and a lower surface opposing the upper surface. The upper surface of the each of the one or more support surfaces 502 can be substantially flat.

The support shell 504 holds the one or more support surfaces 502 in an orientation to support the one or more probe cards or molded probe card protectors placed thereon. The one or more support surfaces 502 can be fixedly attached to the support shell 504 by, for example, soldering or glue. Alternatively, the one or more support surfaces 502 can be removably attached to the support shell 504 by various attachment structures such as screws and fasteners. Further, the one more support surfaces 502 can include attachment structures that mate with selected corresponding mating structures provided to the support shell 504 to vary a distance from the lower surface of the one or more support surfaces 502 to the inner surface of sidewall 310B when the probe card support insert 500 is arranged within the interior of the container body 302. By varying the distance from the lower surface of the one or more support surfaces 502 to the inner surface of sidewall 310B, the support surfaces 502 can be adjusted to accommodate probe cards and molded probe card protectors of different shapes (e.g., vertical dimension) supported thereon.

The support shell 504 can include a sidewall 506A, a sidewall 506B, an outwardly extending flange 508A, an outwardly extending flange 508B, an inwardly extending flange 510A and an inwardly extending flange 510B.

An interior surface of sidewall 506A can be fixedly or detachably connected to a first edge of each of the one or more support surfaces 502, and an interior surface of sidewall 506B can be fixedly or detachably connected to a second edge of each of the one or more support surfaces 502 to hold the one or more support surfaces in the orientation to support the one or more probe cards or molded probe card protectors placed thereon.

Structures that guide the insertion of probe card support insert 500 into the interior of the container body 302, and align the probe card support insert 500 to the interior of the container body 302 will be described below.

The outwardly extending flange 508A can extend away from an exterior surface of the sidewall 506A, and the outwardly extending flange 508B can extend away from an exterior surface of the sidewall 506B. The outwardly extending flange 508A can be positioned on one end of the sidewall 506A that will be closest to the opening 310F of the container body 302 when the probe card support insert 500 is arranged within the container body 302. Similarly, the outwardly extending flange 508B can be positioned on one end of the sidewall 506B that will be closest to the opening 310F of the container body 302 when the probe card support insert 500 is arranged within the container body 302.

The inwardly extending flange 510A can extend away from an interior surface of the sidewall 506A, and the inwardly extending flange 510B can extend away from an interior surface of the sidewall 506B. The inwardly extending flange 510A can be positioned on one end of the sidewall 506A that will be closer to an interior surface of the back plate 310E of the container body 302 when the probe card support insert 500 is arranged within the container body 302. Similarly, the inwardly extending flange 510B can be positioned on one end of the sidewall 506B that will be closer to the interior surface of the back plate 310E of the container body 302 when the probe card support insert 500 is arranged within the container body 302.

The leading edge of the outwardly extending flange 508A that extends away from the exterior surface of the sidewall 506A can define one or more cut outs and/or one or more protrusions 512A. The leading edge of the outwardly extending flange 508B that extends away from the exterior surface of the sidewall 506B can define one or more cut outs and/or one or more protrusions 512B.

Further, the outwardly extending flange 508A can include one or more alignment pin holes 514A, and outwardly extending flange 508B can include one or more alignment pin holes 514B.

The interior surface of the sidewall 310C of the container body 302 can include one or more protrusions 312C1 that correspond to the one or more cut outs 512A of the outwardly extending flange 508A, and one or more cut outs 312C1 that correspond to the one or more protrusions 512A of the outwardly extending flange 508A. The interior surface of the sidewall 310D of the container body 302 can include one or more protrusions 312D1 that correspond to the one or more cut outs 512B of the outwardly extending flange 508B, and one or more cut outs 312D1 that correspond to the one or more protrusions 512B of the outwardly extending flange 508B.

Further, the sidewall 310C of container body 302 can include one or more alignment pins 312C2 that correspond to the one or more alignment pin holes 514A of the outwardly extending flange 508A of support shell 504, and the sidewall 310D of container body 302 can include one or more alignment pins 312D2 that correspond to the one or more alignment pin holes 514B.

The outwardly extending flanges 508A and 508B can be guided by the protrusions and cut outs 312C1 and 312C2, and the alignment pins 312C2 and 312D2 of the container body 302 during insertion of the probe card support insert 500 into the interior space of the container body 302.

Structures that removably connect the external container 300 and the probe card support insert 500 will be described below.

The external container 300 can include a cantilever snap 314 and a cantilever snap 316. Each of cantilever snaps 314 and 316 can include a beam and an overhang. A base end of the beam of the cantilever snap 314 can be fixedly connected to the interior surface of the sidewall 310C of the container body 302, and a front end of the beam of the cantilever snap 314 can extend towards the opening 304 of the container body 302. The overhang of the cantilever snap 314 can project radially from the front end of the beam of the cantilever snap 314. The cantilever snap 316 has a similar structure. A base end of the beam of the cantilever snap 316 can be fixedly connected to the interior surface of the sidewall 310D of the container body 302, and a front end of the beam of the cantilever snap 316 can extend towards the opening 304 of the container body 302. The overhang of the cantilever snap 316 can project radially from the front end of the beam of the cantilever snap 314.

As the probe card support insert 500 is being inserted and guided into the interior space of the container body 302, the protrusions 512A and 512B of the outwardly extending flanges 508A and 508B engage the cantilever snap 314 of the container body 302. That is, a protrusion 512A of the outwardly extending flange 508A engages an entrance side of the overhang of the cantilever snap 314 to deflect the beam of the cantilever snap 314 from a relaxed position of the beam. The protrusion 512A continues to engage the overhang as the probe card support insert 500 is guided towards the back plate 310E of the container body 302 until the protrusion 512A reaches a retraction side of the overhang to allow the beam of the cantilever snap 314 to return to the relaxed position to thereby secure the outwardly extending flange 508A to the container body 302. The outwardly extending flange 508B is similarly secured to the container body 302 through engagement of the protrusion 512B with the overhang of the cantilever snap 316.

To release each of the outwardly extending flanges 508A and 508B from the container body 302, the overhang of the cantilever snap 314 and the overhang of the cantilever 316 can be depressed to deflect the beams of the cantilever snaps 314 and 316 while the outwardly extending flanges 508A and 508B are guided away from the back plate 310E of the container body 302 to pass through the opening 304 of the container body 302.

Structures that minimize the movement of the one or more probe cards or the one or more molded probe card protectors when the one or more probe cards or molded probe card protectors are placed on the support surfaces 502 will be described below.

The leading edge of the inwardly extending flange 510A that extends away from the interior surface of the sidewall 506A and the leading edge of the inwardly extending flange 510B that extends away from the interior surface of the sidewall 506B can define cut outs and protrusions 518A and 518B that correspond to the outer profile of the one or more molded probe card protectors supported by the support surfaces 502.

Further, the inner surface of the back plate 310E can include one or more protrusions that contact the outer surface of the inwardly extending flange 510A and the outer surface of the inwardly extending flange 510B to define a space between the inwardly extending flange 510A and 510B and the inner surface of the back plate 310E.

When the one or more molded probe card protectors are supported by the support surface 502, a portion of the one or more molded probe card protectors is inserted past the inwardly extending flanges 510A and 510B towards the back plate 310E and into the space between the inwardly extending flange 510A and 510B and the inner surface of the back plate 310E. In such an arrangement, a portion of the outer profile of the one or more molded probe card protectors can contact the cut outs and protrusions defined by the leading edges of the inwardly extending flanges 510A and 510B to minimize a movement of the one or more molded probe card protectors and the probe cards held therein in a directions extending away from the support surfaces 502 and horizontal to the support surfaces 502.

Further, as an alternative to the upper surface of each of the support surfaces 502 being flat, the upper surface of the each of the support surfaces 502 can be formed through, for example, molding, to have contours that conform to the bottom of the exterior profile of the supported probe card or the bottom of the exterior profile of the supported molded probe card protector that can minimize movement of the supported probe card or the support molded probe card protector.

As described above, the probe card support insert 500 can be removably housed within the container body 302. The container body 302 can also be configured to house other insert structures. In one example, the container body 302 can be configured to house a thin plate support insert 800.

The thin plate support insert 800 is configured to support one or more thin plates. An example of a thin plate can include, but is not limited to semiconductor wafers, magnetic recording medium disks, optical recording medium disks, glass substrates for liquid crystal, or film substrates for flexible display devices.

The thin plate support insert 800 is further configured to be detachably attached to the container body 302.

Figure 4:
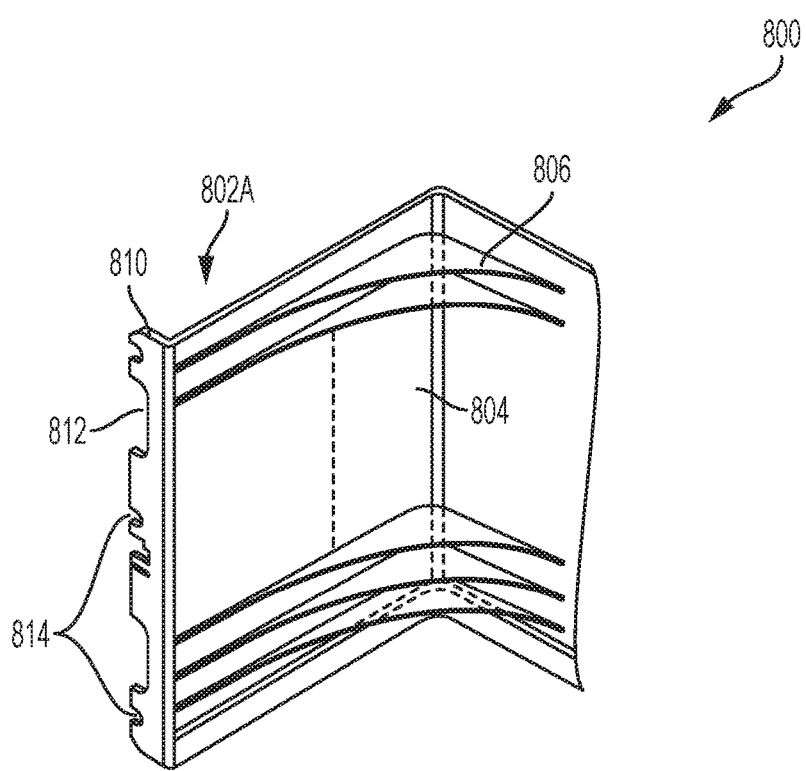
FIG. 4 depicts a perspective view of a thin plate support insert.

An example of the thin plate support insert 800 will be described below with reference to FIG. 4 of the drawings.

Thin plate support insert 800 can include a support panel 802A and a support panel 802B. The structure of the support panel 802B can be a mirror image of the structure of the support panel 802A.

The support panel 802A can include a support plate 804 and a plurality of support pieces 806.

The support plate 804 is configured to be detachably attached to the interior surfaces of one or more of sidewall 310A, sidewall 310B, sidewall 310C, sidewall 310D and back plate 310E. Further, the support plate 804 is configured to support the plurality of support pieces 806 in a state where the plurality of support pieces 806 are disposed in parallel at predetermined intervals.

The support plate 804 can include a support plate side panel 808. The plurality of support pieces 806 are fixedly connected to an inner surface of the support plate side panel 808 to be disposed in parallel at predetermined intervals.

The support plate 804 can further include an outwardly extending flange 810 extending from an exterior surface of the support plate 804. The outwardly extending flange 810 can be positioned on one end of the support plate side panel 808 that will be closest to the opening 304 of the container body 302 when the support panel 802A is arranged within the container body 302. The leading edge of the outwardly extending flange 810 that extends away from the exterior surface the support plate 804 can define one or more cut outs and/or one or more protrusions 812. Further, the outwardly extending flange 810 can define one or more alignment pin holes 814. The relative spacing of one or more cut outs and or protrusions 812 and the one or more alignment pin holes 814 can be substantially identical to the relative spacing of the one or more cut outs and/or protrusions 512A and the one or more alignment pin holes 514A such that the outwardly extending flange 810 (and support panel 802A) can be guided by the above-described structures of the container body 302 during insertion of support panel 802A into the interior space of the container body 302 and secured by the above-described structures of the container body 302 to the container body 302. For example, during insertion of the support panel 802A into the interior space of the container body 302, the plurality of cut outs and/or protrusions 812 can be aligned with the corresponding protrusions and cut outs 312C1 of the container body, and the plurality of alignment pin holes 814 can be aligned with the corresponding alignment pins 312C2, as the support panel 802A is passed through opening 304 of the container body 302 towards the back plate 310E, such that the protrusions and cut outs 312C1 guide cut outs and/or protrusions 812 and the alignment pins 312C2 guide the alignment pin holes 814 towards a position where the support panel 802A is secured to the container body 302. As the support panel 802A is being guided, the support panel 802A engages the cantilever snap 314 of the container body 302. That is, a protrusion 812 of the outwardly extending flange 810 engages the entrance side of the overhang of the cantilever snap 314 to deflect the beam of the cantilever snap 314 from a relaxed position of the beam. The protrusion 812 continues to engage the overhang as the support panel 802A is guided towards the back plate 310E of the container body 302 until the protrusion 812 reaches the retraction side of the overhang to allow the beam of the cantilever snap 314 to return to the relaxed position to thereby secure the support panel 802A to the container body 302.

To release the support panel 802A from the container body 302, the overhang of the cantilever snap 314 can be depressed to deflect the beam of the cantilever snap 314 while the support panel 802A is guided away from the back plate 310E of the container body 302 to pass through the opening 304 of the container body 302.

Other connecting structures for connecting the thin plate support insert 800 to the container body 302 can be provided. For example, the support plate 804 and the interior surface of the sidewall 310C of the container body 302 can be provided with components of an interference fit. Such an interference fit can include a plurality of shafts in the support plate 804, and a corresponding plurality of holes in the interior surface of the sidewall 310C. The plurality of shafts in the support plate 804 can be pushed into the plurality of holes in the sidewall 310C whereby the support plate 804 is connected to the sidewall 310C by friction between the shafts and surfaces of the sidewall 310C defining the plurality of holes.

Each of the plurality of support pieces 806 can have a shape that conforms to the shape of a thin plate supported by the support piece 806. For example, when the support panel 802A is secured to the container body 302, the support piece 806 is provided so as to extend from an inner area closest to the back plate 310E to an intermediate area closest to the sidewall 310C, and from the intermediate area to an outer area closest to the opening 304. Each of the plurality of support pieces 806 has a profile that can directly contact and support an outer peripheral area of the thin plate while avoiding a usable area of the thin plate.

The above-described probe card support insert 500 and the above-described thin plate support insert 800 can be replaceably secured to the same container body 302 through connection to common connection structures such as cantilever snaps 314 and 316. Therefore, it is contemplated that the same container body 302 can be adapted for transportation of different items such a thin plates and probe cards depending on the insertable structure (e.g., probe card support insert 500 and thin plate support insert 800) that is inserted into and connected to the container body 302. Such an interchangeable feature is utilized in the system and method embodiments described below.

Figure 5:
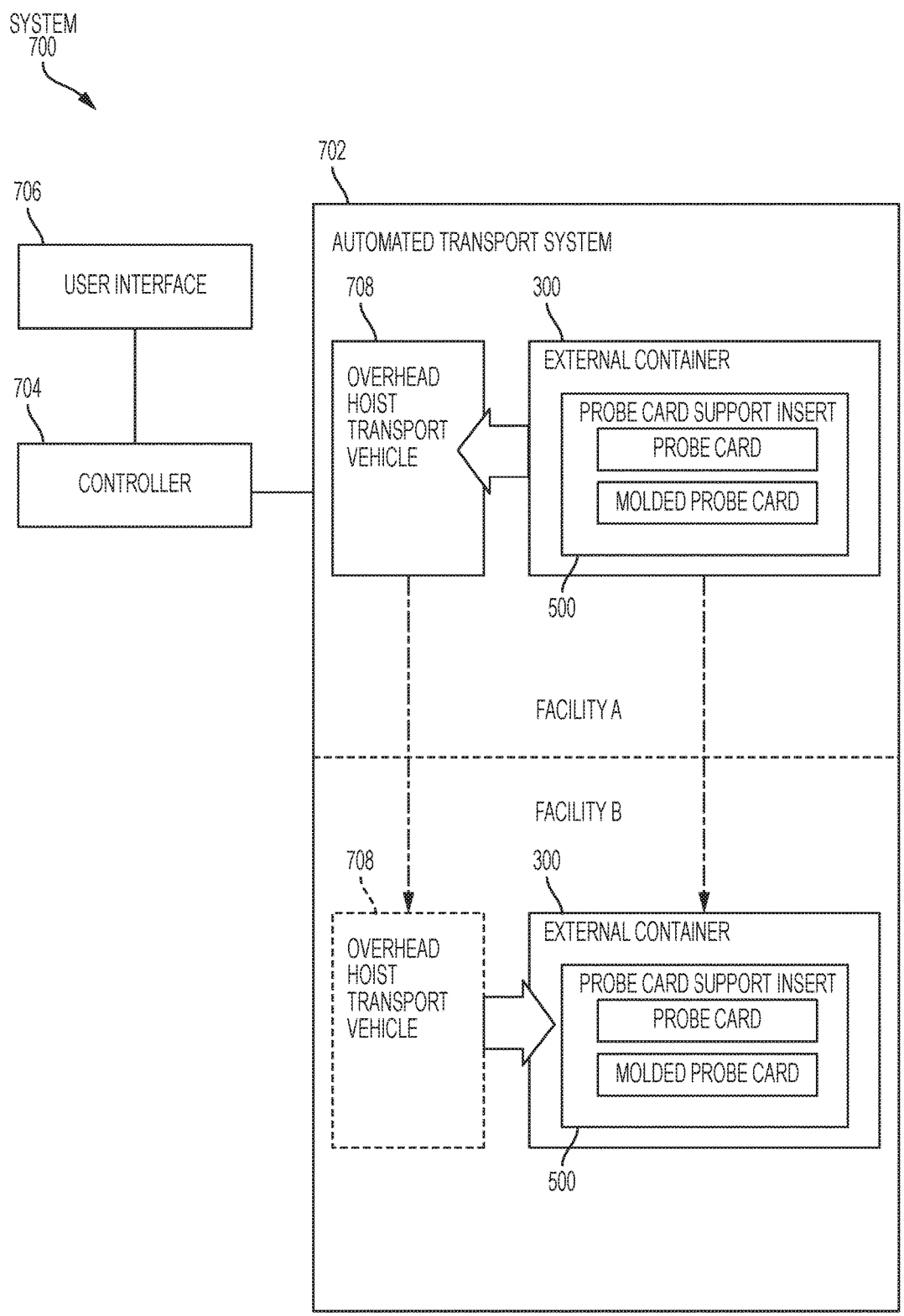
FIG. 5 depicts a system for transporting one or more probe cards.

Next, a system 700 for storing and transporting one or more probe cards will be described below with reference to FIG. 5.

The system 700 can include an automated transport system 702, a controller 704, a user interface 706, the external container 300 and the probe card support insert 500 (and/or the thin plate support insert 800 interchangeably with the probe card support insert 500).

The system 700 can be operated in an environment that includes a facility A and a facility B. An example of facility A can be a clean storage facility for one or more probe cards. An example of facility B can be a clean testing facility at which a wafer testing step is conducted.

The automated transport system 702 can include an overhead hoist transport vehicle 708 that can be controlled by the controller 704 based on instructions from a technician inputted through the user interface 706.

The overhead hoist transport vehicle 708 is configured to travel along an overhead track system that extends between at least facility A and facility B. The overhead hoist transport vehicle 708 is configured to access and deposit the external container 300 at facility A and facility B by, for example, grasping and releasing the grip 308 of the external container 300.

The user interface 706 is configured to receive an instruction from the technician to transport one or more probe cards from facility A to facility B. The controller 704 can be configured to instruct, through a display or another output device, the technician to retrieve the external container 300. Alternatively, the controller 704 can be configured to control an automated retrieval system (or the overhead hoist transport vehicle 708) to retrieve the external container 300. The technician can then remove the lid 306 of the external container 300 from the container body 302 to expose the opening 304, and replace the thin plate support insert 800 in the external container 300 with the probe card support insert 500. Thereafter, the technician can then load one or more probe cards and/or one or more molded probe card protectors (having the one or more probe cards therein) into the external container 300 to be supported by the one or more support surfaces 502. Thereafter, the technician can then secure the lid 306 of the external container 300 to the container body 302 to close the opening 304. Next, the technician can place the external container 300 into an area such as a load port where the overhead hoist transport vehicle 708 can grasp the grip 308 of the external container 300.

The controller 704 can be configured to control the overhead hoist transport vehicle 708 to grasp the grip 308 of the external container 300, to move from facility A to facility B, and to release the grip 308 of the external container 300 to thereby deposit external container 300 in facility B.

In the above description, the controller 704 can be implemented by a computer including one or more processors configured to read instructions stored in a memory to execute the above-described functions and controls. Further, the user interface 706 can be implemented by devices such as a keyboard, a mouse, and/or a touch screen user interface.

Next, a method for storing and transporting one or more probe cards will be described below with reference to FIGS. 6-8.

Figure 6:
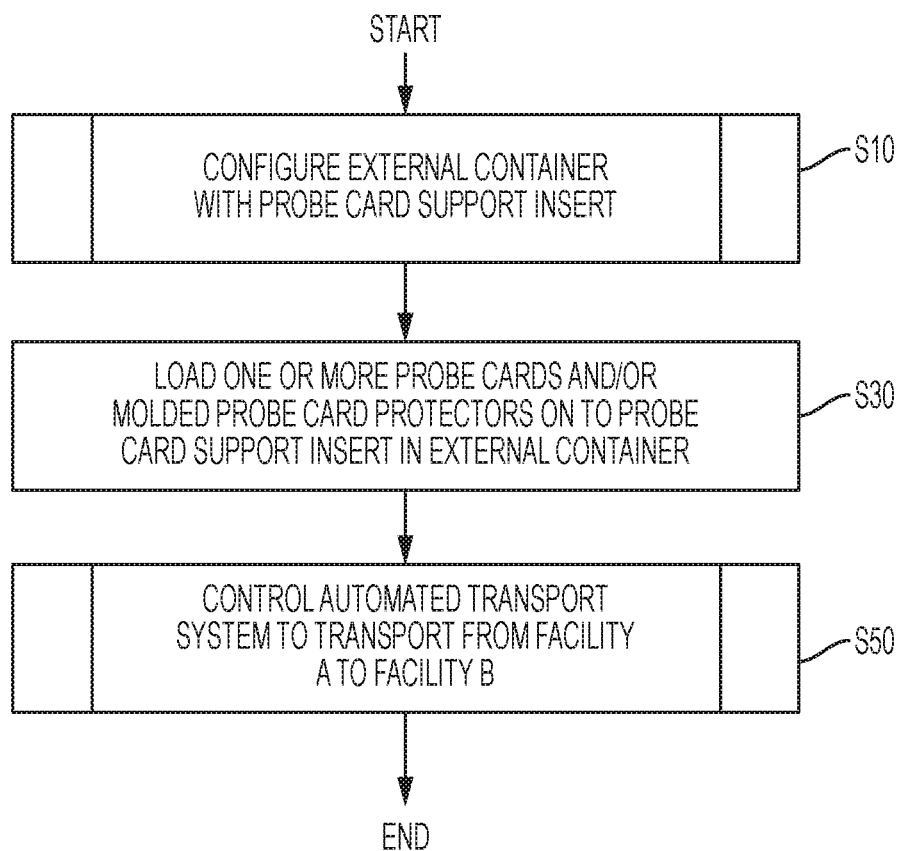
FIG. 6 depicts a method for transporting one or more probe cards.

Referring to FIG. 6, the method can include a Step S10 of configuring the external container 300 with the probe card support insert 500, a Step S30 of loading one or more probe cards and/or molded probe card protectors (having the one or more probe cards therein) into the external container 300 with the probe card support insert 500 inserted therein and a Step S50 of controlling the automated transport system 702 to transport the external container 300, the probe card support insert 500 and the one or more probe cards and/or molded probe card protectors from facility A to facility B.

Figure 7:
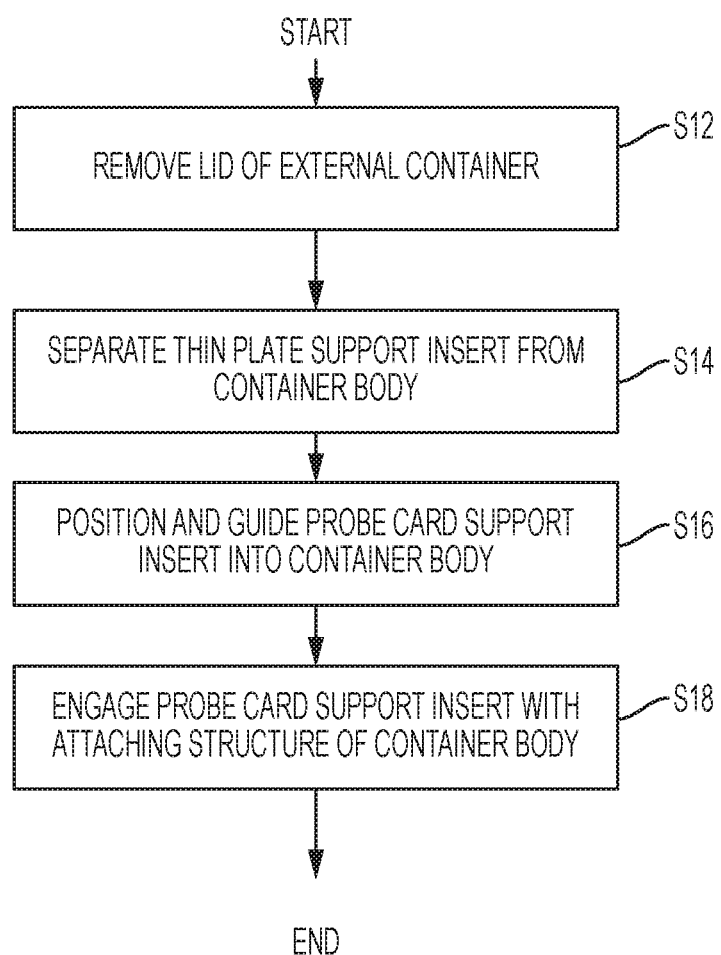
FIG. 7 depicts a method of configuring an external container with a probe card support insert.

Referring to FIG. 7, step S10 of configuring the external container 300 with the probe card support insert 500 can further include a step S12 of removing the lid 306 of the external container 300 from the container body 302 to expose the opening 304. The, step S10 can further include a step S14 of separating the thin plate support insert 800 from the container body 302 and removing the thin plate support insert 800. The step S10 can further include a step S16 of guiding the probe card support insert 500 through the opening 304 and into the interior of the container body 302. Step S16 can include positioning the outwardly extending flanges 508A and 508B such that the cut outs and protrusions 512A and 512B and the alignment pin holes 514A and 514B align with the protrusions and cut outs 312C1 and 312D1 and the alignment pins 312C2 and 312D2 of the container body 302, and guiding the probe card support insert 500 along the protrusions and cut outs 312C1 and 312D1 and the alignment pins 312C2 and 312D2 towards the back plate 310E of the container body 302. The step S10 can further include a step S18 of engaging the probe card support insert 500 with attaching structures to removably attach the probe card support insert 500 to the container body 302. Step S18 can include engaging the protrusions 512A and 512B of the probe card support insert 500 with the cantilever snaps 314 and 316 of the container body 302 to attach the probe card support insert 500 to the container body 302.

Next, Step S30 can include placing each of the probe card and/or molded probe card protector (having the probe card therein) on the support surface 502 of the probe card support insert 500. Further, the molded probe card protector can be inserted towards the back plate 310E of the container body 302 until a portion of the molded probe card protector is arranged in the space between the back plate 310E and the inwardly extending flanges 510A and 510B of the probe card support insert 500 such that the molded probe card protector engages the cut outs and protrusions 518A and 518B of the inwardly extending flanges 510A and 510B to minimize movement of the molded probe card protector during transportation of the same. Step S30 can further include securing the lid 306 of the external container 300 to the container body 302 to close the opening 304.

Figure 8:
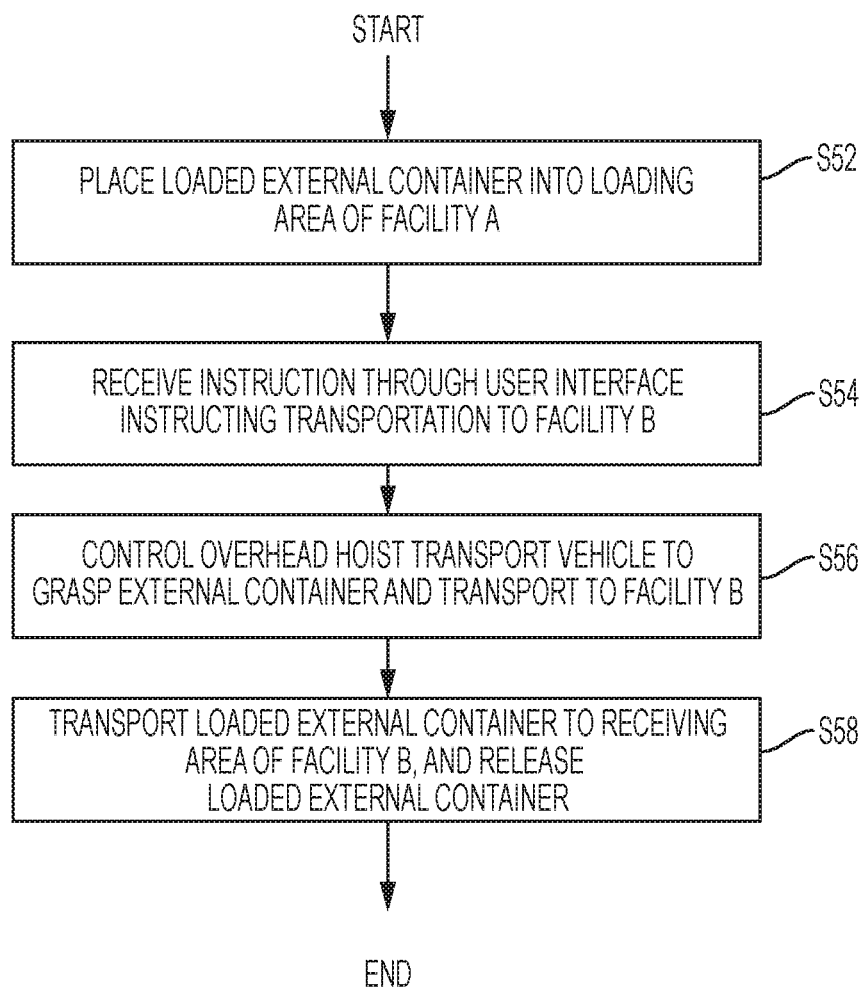
FIG. 8 depicts a method of controlling an automated transport system to transport one or more probe cards stored in an external container from a facility A to a facility B.

Referring to FIG. 8, Step S50 of controlling the automated transport system 702 to transport the external container 300, the probe card support insert 500 and the one or more probe cards and/or molded probe card protectors from facility A to facility B can include Step S52 of placing the loaded external container 300 into an area such as a load port of facility A to await transportation. Next, in a Step S54, the controller 704 can receive an instruction entered through the user interface 706 instructing transportation of the loaded external container 300 from facility A to facility B. Next, in a Step 56, the controller 704 can control the overhead hoist transport vehicle 708 to grasp the grip 308 of the loaded external container 300 and transport the grasped external container 300 along the overhead rails from facility A to facility B. Next, in Step S58, the controller 704 can control the overhead hoist transport vehicle 708 to transport the loaded external container 300 to a designated area or a receiving bay in facility B, and release the grip on grip 308 of the external container 300 to thereby complete delivery of the probe cards and or molded probe card protectors storing the probe cards to facility B.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A container for storing at least one probe card arranged in a molded probe card protector, the container comprising:
    a probe card support insert;
    a container body comprising an interior surface configured to define:
        an interior space for housing the probe card support insert; and
        an opening sized to allow insertion and removal of the probe card support insert into and out of the interior space along an insertion-removal axis substantially perpendicular to the direction of gravity,
    wherein the container body comprises:
        two container body sidewalls extending away from the opening substantially along the insertion-removal axis; and
        a container body back wall connecting the two container body sidewalls and opposing the opening in the insertion-removal axis; and
    a lid configured to be removably fitted to the opening of the container body to close the opening,
    wherein the probe card support insert is configured to be removably connected to the interior surface of the container body,
    wherein the probe card support insert comprises:
        a probe card support surface configured to support the molded probe card protector in the direction of gravity; and
        a first flange and a second flange,
        wherein in a configuration in which the probe card support insert is connected to the interior surface of the container body,
            the first flange and the second flange are separated by a space from the container body back wall along the insertion-removal axis;
            a leading edge of the first flange and a leading edge of the second flange extend towards each other along an axis substantially perpendicular to the direction of gravity and the insertion-removal axis,
            wherein the leading edge of the first flange and the leading edge of the second flange define cut outs and protrusions that correspond to an outer profile of the molded probe card protector such that when the molded probe card protector is supported by the probe card support surface and the lid is fitted to the opening of the container body, a portion of the outer profile of the molded probe card protector is arranged in the space between the first flange and the second flange and the container body back wall, and the leading edge of the first flange and the leading edge of the second flange contact the outer profile of the molded probe card protector to reduce movement of the molded probe card protector relative to the container body.

2. The container according to claim 1, wherein the container body further comprises a grip configured to be grasped and released by a transport mechanism for transporting the container from a first area to a second area.

3. The container according to claim 1,
    wherein the interior surface of the container body comprises a container body-side connection structure,
    wherein the probe card support insert comprises a probe card support insert-side connection structure configured to be removably connected to the container body-side connection structure to connect the interior surface of the container body and the probe card support insert.

4. The container according to claim 3
    wherein the probe card support insert-side connection structure comprises a protrusion, and
    wherein the interior surface of the container body comprises a snap-fit structure configured to mate with the protrusion of the probe card support insert-side connection structure to removably connect the probe card support insert to the interior surface of the container body.

5. The container according to claim 4,
wherein the protrusion of the probe card support insert-side connection structure defines one or more alignment pin holes, and
wherein the interior surface of the container body comprises one or more corresponding alignment pins configured to be mated with the one or more alignment pin holes to guide the insertion of the probe card support insert into the interior space of the container body.

* * * * *